United States Patent [19]
Nam

[11] Patent Number: 6,025,651
[45] Date of Patent: Feb. 15, 2000

[54] SEMICONDUCTOR PACKAGE STRUCTURES USING EPOXY MOLDING COMPOUND PADS AND A METHOD FOR FABRICATING THE EPOXY MOLDING COMPOUND PADS

[75] Inventor: Shi-baek Nam, Inchun, Rep. of Korea

[73] Assignee: Samsung Electronics Co., Ltd., Suwon, Rep. of Korea

[21] Appl. No.: 09/090,861

[22] Filed: Jun. 5, 1998

[30] Foreign Application Priority Data

Jun. 16, 1997 [KR] Rep. of Korea ............ 97-24800

[51] Int. Cl.[7] .................. H01L 23/34; H01L 23/29; H01L 23/495
[52] U.S. Cl. .................. 257/788; 257/728; 257/781; 257/782; 257/784; 257/777; 257/778; 257/723; 257/669
[58] Field of Search .................. 257/788, 728, 257/781, 782, 784, 777, 723, 669, 778

[56] References Cited

U.S. PATENT DOCUMENTS

| | | | |
|---|---|---|---|
| 5,614,860 | 3/1997 | Osaki et al. | 327/552 |
| 5,786,271 | 7/1998 | Ohida et al. | 438/615 |
| 5,790,377 | 8/1998 | Schreiber et al. | 361/704 |

FOREIGN PATENT DOCUMENTS 405166961  7/1993  Japan ................. 257/783

*Primary Examiner*—Mahshid Saadat
*Assistant Examiner*—Matthew E. Warren
*Attorney, Agent, or Firm*—Jones Volentine, L.L.P.

[57] ABSTRACT

A semiconductor package has a controlling IC attached to a die pad using an epoxy molding compound (EMC) pad. The EMC pad is formed so as to be slightly larger than the controlling IC. EMC pads are cut from an EMC pad pattern which is formed from a predetermined number of EMC tablets. The EMC pad pattern is molded by heating and pressing the EMC tablets into a wafer shape having a thickness of approximately 0.3 mm and a diameter of approximately 100 mm. Such a thin EMC pad is capable of providing sufficient dielectric strength, and allows for manufacturing of semiconductor packages at lower cost. In addition, conventional equipment can be used to fabricate the semiconductor packages. The packages are flexible, and even a thin package is not easily broken.

5 Claims, 4 Drawing Sheets

SEMICONDUCTOR PACKAGE STRUCTURES USING EPOXY MOLDING COMPOUND PADS AND A METHOD FOR FABRICATING THE EPOXY MOLDING COMPOUND PADS

BACKGROUND OF THE INVENTION

1. Field of the Invention

The present invention relates to a semiconductor package structure, and more particularly, to a semiconductor package structure including a MOSFET and a controlling integrated circuit (IC) integrated into one package, wherein the controlling IC is attached to a lead frame using an epoxy molding compound (EMC) pad between the controlling IC and the lead frame. The present invention also relates to a method for fabricating the EMC pad.

2. BACKGROUND OF THE RELATED ART

With the trend toward smaller and lighter electronic products, efforts continue in order to reduce the number of semiconductor parts, while developing higher density mounting packages. A Switching Mode Power Supply (SMPS) method is being used to satisfy the above and other recent trends. In SMPS structures, semiconductor devices that require a large quantity of power and/or emit a large quantity of heat during the operation, i.e., a MOSFET that is used as a power transistor and a controlling IC for controlling the MOSFET, are integrated in a single package and sealed hermetically.

According to the SMPS method, first, the switching device such as the MOSFET and the controlling IC are wire bonded to each other so that they can communicate with each other. Second, the functions of peripheral devices are inserted into the controlling IC. The switching device and the controlling IC are then integrated in a single package.

In developing such a package, an insulating adhesive material is used for preventing a short between the controlling IC and a drain of the MOSFET switching device.

Various methods for enhancing the dielectric strength of the insulating adhesive material have been provided. First, a $Si_xN_y$ layer, for example a $Si_3N_4$ layer, is applied to a back side of a wafer up to a thickness of from 2 to 5 $\mu$m. Generally, the layer is deposited approximately 1 $\mu$m at a time. Accordingly, the number of applications can be reduced or increased depending upon the desired thickness. Thereafter, the wafer is divided into respective controlling ICs 1 as shown in FIG. 1. The divided controlling IC 1 is mounted to a portion of a die pad 5 using an insulating epoxy adhesive material 3. On another portion of the die pad 5, a MOSFET 2 is mounted using a conductive solder adhesive material 4. The IC 1 is wire bonded to the MOSFET 2 using a metallic wire 10. The IC 1 and the MOSFET 2 are bonded to inner leads of a lead frame using metallic wires (not shown). Thereafter, an encapsulation step and a trimming step complete the package.

However, it is difficult to achieve a thick layer of insulating material by deposition onto the back side of the wafer. Also, when the wafer is sawed into pieces to form individual chips, the insulating material is not present on the lateral sides of the chips. This results in a reduced dielectric strength.

As shown in FIG. 2, a controlling IC 1 and a power device 2, such as a MOSFET or a bipolar transistor, are mounted on a die pad 5 of a lead frame. The power device 2 is mounted on the die pad 5 using a conductive solder adhesive material 4 because a back side of the MOSFET is used as a drain. On the other hand, the controlling IC 1 is mounted on the die pad 5 using an insulating epoxy adhesive material 3 because the controlling IC 1 should be electrically isolated from the die pad 5. In the adhesive material for the controlling IC 1, i.e., the insulating epoxy adhesive material 3, solid insulating beads 9 may be added. The insulating beads 9 allow for precise thickness adjustment of the epoxy adhesive material 3.

However, it is difficult to find a material having a high dielectric strength at a high temperature for use as the beads. Also, it is not easy to form the beads in a spherical shape so as not to cause any voids. Furthermore, when the adhesive material including the beads is provided, semiconductor manufacturers cannot inspect for the existence of the beads in the adhesive material.

FIG. 3 is a semiconductor package using a ceramic pad. Before the controlling IC 1 is mounted on the die pad 5, a ceramic pad 6 is attached to the die pad 5 using an adhesive material 7. The ceramic pad 6 is a thin film of a ceramic material such as $Al_2O_3$. The controlling IC 1 is insulated from the die pad 5 by the ceramic pad 6. As a result, a sufficient dielectric strength can be obtained.

However, incorporating the ceramic pad greatly increases production costs. In addition, since the ceramic pad is thin, it is easily broken by an external impact.

SUMMARY OF THE INVENTION

It is therefore an object of the present invention to provide a semiconductor package structure having a sufficient dielectric strength, which can be produced in conventional equipment at a low cost.

It is another object of the present invention to provide a method for fabricating a semiconductor package that has the above structure using an epoxy molding compound (EMC) pad.

According to an aspect of the present invention, a semiconductor package structure comprises at least one first semiconductor chip, at least one EMC pad and a second semiconductor chip. The first semiconductor chip is mounted on a die pad using a conductive adhesive material. The EMC pad is attached to the die pad using a first insulating adhesive material. The second semiconductor chip is mounted on the EMC pad using a second insulating adhesive material.

Preferably, the first semiconductor chip is a MOSFET, and each of the first and the second insulating adhesive material includes an epoxy. Preferably, the EMC pad is larger than the second semiconductor chip. More preferably, the EMC pad is larger than the second semiconductor chip by 1 mm on all sides.

According to another aspect of the present invention, a method for fabricating an EMC pad comprises the steps of: pre-baking a predetermined number of EMC tablets; pressing the tablets using a die, thereby molding the tablets into an EMC pad pattern having a predetermined thickness; cooling the EMC pad pattern; checking the EMC pad pattern for uniform thickness and for the absence of voids; curing the EMC pad pattern; and sawing the EMC pad pattern into EMC pads each having a predetermined size.

Preferably, the EMC tablets are molded at a temperature of 160° C. to 180° C., for example, for approximately one minute. A wax is applied to contacting surfaces of the die after four to five cycles of the molding step.

In addition, preferably, the cooling step is carried out while pressing an upper and a lower surface of the EMC pad pattern. Preferably, the curing step is carried out at 160° C. to 180° C., for example, for approximately three hours.

Preferably, the method for fabricating an EMC pad further comprises a step for attaching an expanding tape to the lower surface of the EMC pad pattern prior to the sawing step. In addition, the EMC pad pattern is preferably sawed into the EMC pads, each of which is larger than the controlling IC. The EMC pad pattern has a thickness of 0.3 mm and a diameter of 100 mm.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

Figure 1:
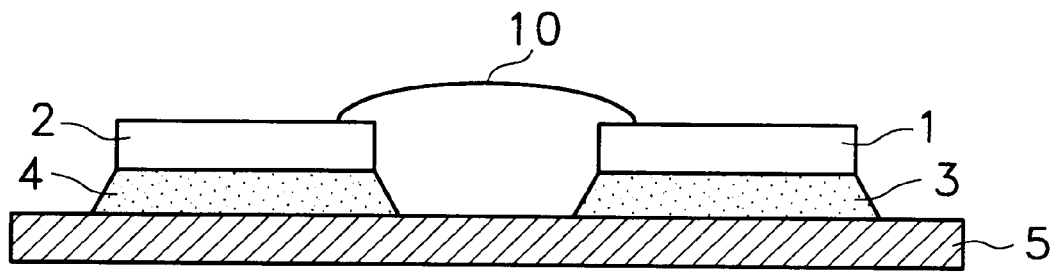
FIG. 1 is a cross sectional view of an embodiment of a conventional semiconductor package.
Figure 2:
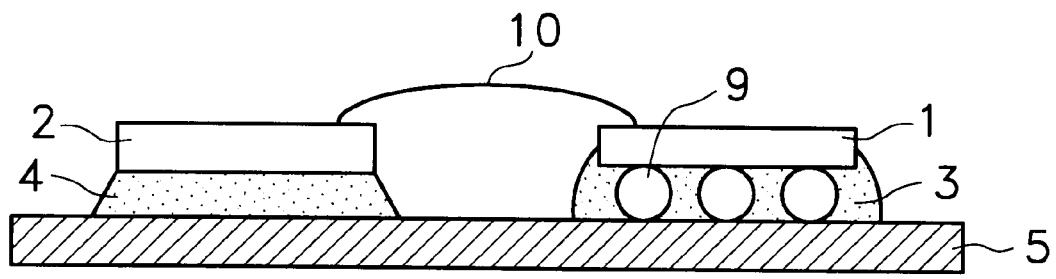
FIG. 2 is a cross sectional view of another embodiment of the conventional semiconductor package.
Figure 3:
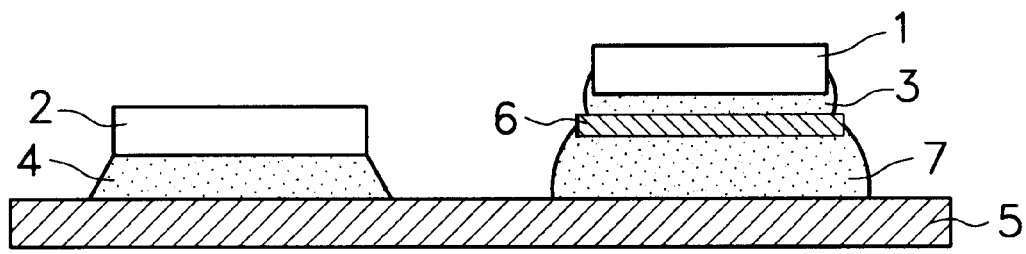
FIG. 3 is a cross sectional view of still another embodiment of the conventional semiconductor package.
Figure 4:
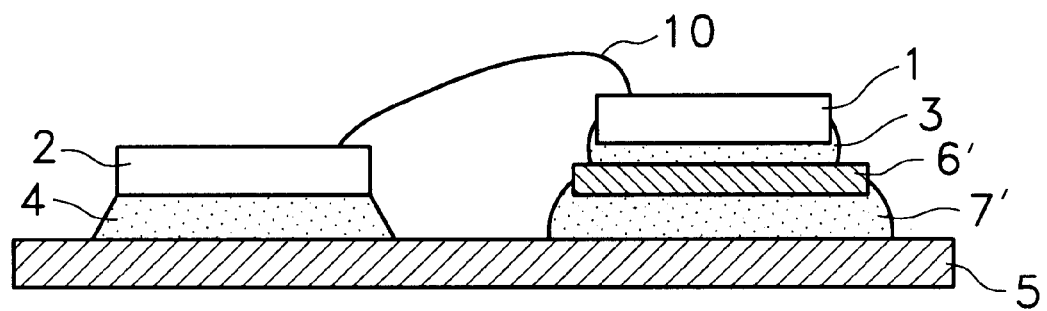
FIG. 4 is a cross sectional view of a semiconductor package according to the present invention.

FIG. 4 is a cross sectional view of a semiconductor package according to the present invention. As shown in FIG. 4, a power device 2, such as a MOSFET or bipolar transistor, is mounted on a portion of a die pad 5 of a lead frame. On another portion of the die pad 5, a controlling IC 1 is mounted with an EMC pad 6' between the IC 1 and the die pad 5.

More particularly, the MOSFET 2 is mounted on the portion of the die pad 5 using a conductive solder adhesive material 4. The EMC pad 6', formed of an EMC resin with a thickness of 0.3 mm, is attached to the other portion of the die pad 5 using an adhesive material 7' to secure the EMC pad 6' to die pad 5 before mounting the controlling IC 1. The EMC pad 6' is slightly larger than the controlling IC 1, preferably by about 1 mm on all sides. The adhesive material 7' for the EMC pad 6' is generally an epoxy or a polyimide-based insulating adhesive material. The controlling IC 1 is mounted on the EMC pad 6' using an epoxy insulating adhesive material 3. The MOSFET 2 and the controlling IC 1 are then bonded to each other by a wire 10. Thereafter, an encapsulation step and a trimming step complete a semiconductor package.

Figure 5A:
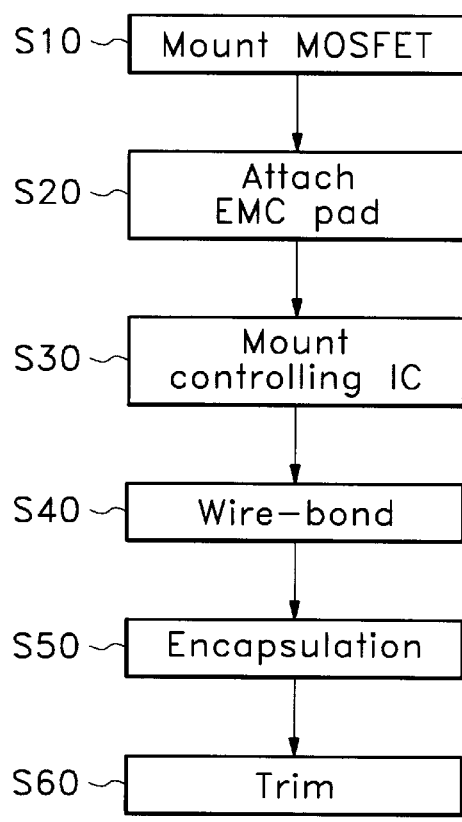
FIG. 5A is a flow chart showing a method for fabricating a semiconductor package according to the present invention.
Figure 5B:
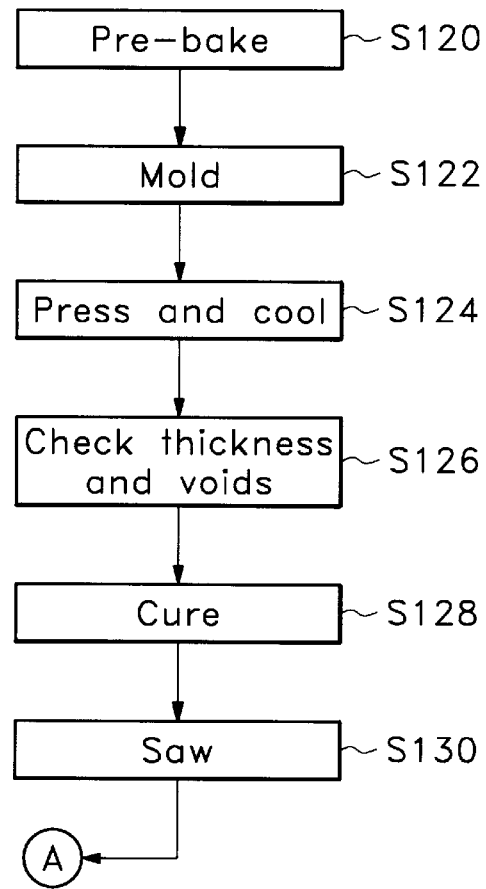
FIG. 5B is a flow chart showing a method for fabricating an EMC pad according to the present invention.

FIG. 5A is a flow chart showing a method for fabricating a semiconductor package according to the present invention. FIG. 5B is a flow chart showing a method for fabricating an EMC pad for use in fabricating the semiconductor package of the present invention.

Referring to FIG. 5A, at step S10, a power device, for example a MOSFET 2, is mounted on a portion of a die pad 5 of a lead frame using a conductive solder adhesive material 4.

At step S20, an EMC pad 6' is attached to another portion of the die pad 5 using an insulating adhesive material 7', for example, an epoxy or a polyimide-based adhesive material. The EMC pad 6' has been fabricated in advance via a separate process as described later with reference to FIG. 5B. The pre-fabricated EMC pad 6' is transferred and attached to the die pad 5 using a conventional die bonder.

After the EMC pad 6' is attached, a controlling IC 1 is mounted on the EMC pad 6' using an epoxy insulating adhesive material 3 at step S30.

Thereafter, at step S40, the MOSFET 2 and the controlling IC 1 are bonded to each other by a wire 10. All of the above described parts are encapsulated with an epoxy resin at step S50, which is followed by a trimming step S60. As a result, a semiconductor package is completed.

Figure 6:
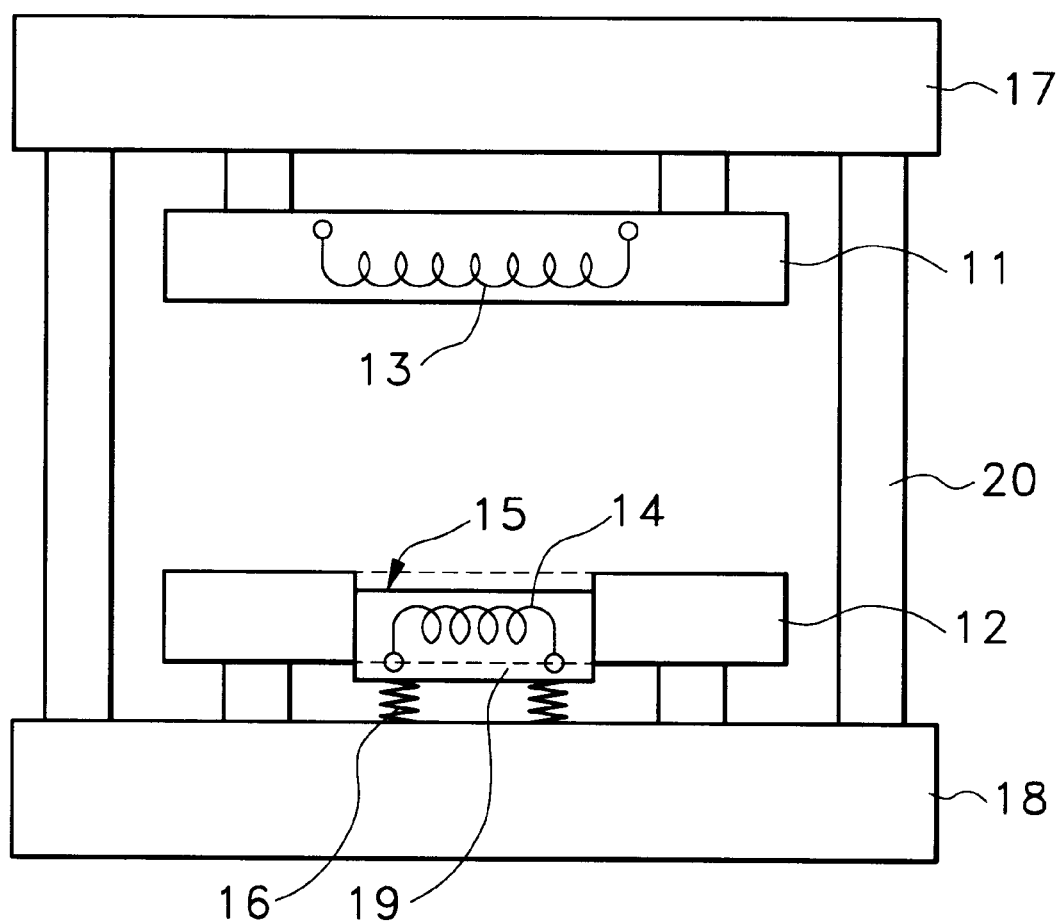
FIG. 6 is a schematic view of an apparatus for fabricating an EMC pad according to the present invention.

Referring to FIGS. 5B and 6, the method for fabricating the EMC pad for use in fabricating the semiconductor package according to the present invention is as follows.

First, in order to fabricate an EMC pad pattern having a predetermined thickness and a predetermined diameter, from which the EMC pads will eventually be cut, a predetermined number of EMC tablets are pre-baked for approximately one minute in a microwave oven or the like, which is shown as step S120 in FIG. 5B. For example, if the EMC pad pattern is to have a diameter of 100 mm and a thickness of 0.3 mm the predetermined number of tablets will weigh approximately 3.2 to 3.8 g. In addition, it is preferable to use tablets having a white coloring material, for easy recognition during die attachments.

The pre-baked tablets are placed near the center of a lower die 12 of a press (FIG. 6), and are molded into a predetermined pad pattern, for example, into the shape of a wafer according to an embodiment of the present invention, by pressing using an upper die 11, which is shown as step S122 in FIG. 5B. A movable die 19 that is supported by springs 16 is located at the center of the lower die 12 in which a heater 14 is installed. Normally, as shown in dotted lines, the upper surface of the movable die 19 is level with the upper surface of the lower die 12, and the sides of the movable die 19 slidably contact an inside surface of the lower die 12. However, when the tablets are being pressed by upper die 11, the springs 16 are compressed and the movable die 19 is pushed downward, as shown in solid lines, such that a tablet insertion groove 15 is formed by the upper surface of the movable die 19 and the exposed upper region of the inside surface of the lower die 12. As the tablets soften under heat and pressure, they fill in the tablet insertion groove 15 so as to form the EMC pad pattern. When the pressure is released, the movable die 19 is moved upward by the relaxation of springs 16. Thereby, the EMC pad pattern can be removed from the lower die 12 and transferred to a cooling press (not shown) for further processing as described below.

Upper die 11 has a heater 13 and is fixed to a base 17, and lower die 12 is fixed to a base 18. Base 17 slides up and down on guide posts 20. A condition for molding the EMC pad pattern is, for example, a temperature of 160° C. to 180° C. and a pressing time of approximately one minute. This is an embodiment of the molding condition determined based on the consideration of the thin EMC pad and the productivity. After four to five cycles of press operation, it is preferable to apply a wax to the surfaces of upper and lower dies 11 and 12 and movable die 19, because repeated opening and closing operations of the dies 11, 12 and 19 may cause the EMC pad pattern to stick to the dies.

Thereafter, the EMC pad pattern is cooled at step S124. During the cooling step, the EMC pad pattern may warp. Accordingly, it is preferable to cool the EMC pad pattern while pressing the upper and the lower surface thereof.

At step S126, the EMC pad pattern is checked for uniform thickness, and for the absence of voids. Preferably, the thickness of the EMC pad pattern is approximately 0.3 mm and the diameter thereof is approximately 100 mm.

At step S128, the EMC pad pattern is cured at a temperature of 160° C. to 180° C. for approximately three hours. Generally, in the event that the curing time exceeds three hours, the EMC pad may be warped. In addition, since the EMC pad is black, the die bonder does not recognize the EMC pad when the EMC pad is attached to the die pad. Therefore, for easy recognition, a colorant may be added to the EMC pad to change the color of the EMC pad to gray. When the EMC pad is cured for up to three hours, the color of the EMC pad changes to a light yellow, which should not cause any problem in recognizing the EMC pad. On the other hand, when the EMC pad is cured for more than three hours, the color of the EMC pad may change to a dark yellow, which may cause a problem in recognizing the EMC pad. At step S130, an expanding tape having a wafer shape is attached to the lower surface of the EMC pad pattern. The EMC pad pattern is then sawed into EMC pads, each having a predetermined size that is slightly larger than the controlling IC.

As a reliability test, the EMC pads fabricated through the aforementioned method are subjected to a high temperature reverse bias (HTRV) test in which the EMC pads are left at 125° C. for 500 hours after a voltage of 800 V is supplied to the EMC pads. In the HTRV test, insulation break down does not occur in the EMC pads fabricated through the aforementioned method.

As described above, the EMC pads 6' are then transferred and attached to a die pad at step S20 in the package fabrication process shown in FIG. 5A.

Accordingly, it is possible to fabricate a thin pad having sufficient dielectric strength by mounting the controlling IC on the die pad with the EMC pad between the IC and the die pad. Using the EMC pads, it is also possible to manufacture semiconductor packages at lower cost. According to the present invention, conventional equipment can be used to fabricate the EMC pads. The packages fabricated as described above are flexible, and even a thin package may not be easily broken.

This invention has been described above with reference to the aforementioned embodiment. It is evident, however, that many alternatives, modifications and variations will be apparent to those skilled in the art in light of the foregoing description. Accordingly, the present invention is intended to embrace all such alternatives, modifications and variations as fall within the spirit and scope of the appended claims.

What is claimed is:

1. A semiconductor package structure comprising:

a power semiconductor chip mounted on a die pad using a conductive adhesive material;

an epoxy molded compound (EMC) pad attached to said die pad using a first insulating adhesive material; and a controlling integrated circuit chip mounted on said EMC pad using a second insulating adhesive material, wherein the epoxy molded compound has a predetermined resilience to protect the controlling integrated circuit chip against an external impact, and wherein the EMC pad is a single rigid pad.

2. The semiconductor package structure according to claim 1, wherein said first semiconductor chip comprises a MOSFET.

3. The semiconductor package structure according to claim 1, wherein said first and said second insulating materials comprise an epoxy.

4. The semiconductor package structure according to claim 1, wherein said EMC pad is larger than said second semiconductor chip.

5. The semiconductor package structure according to claim 4, wherein said EMC pad is larger than said second semiconductor chip by 1 mm on all sides.

* * * * *